US006244634B1

(12) United States Patent
Robinson

(10) Patent No.: US 6,244,634 B1
(45) Date of Patent: Jun. 12, 2001

(54) APPARATUS FOR ACTUATING THE RETAINING LOCKS OF A CASSETTE

(75) Inventor: Keith Robinson, Caldwell, ID (US)

(73) Assignee: Micron Electronics, Inc., Nampa, ID (US)

( * ) Notice: Subject to any disclaimer, the term of this patent is extended or adjusted under 35 U.S.C. 154(b) by 0 days.

(21) Appl. No.: 08/923,359

(22) Filed: Sep. 4, 1997

(51) Int. Cl.[7] .................................................. E05C 1/06
(52) U.S. Cl. ........................ 292/33; 292/32; 81/15.9; 206/710; 206/711; 206/456; 211/41.12; 118/500
(58) Field of Search ................... 108/55.1, 27; 211/153, 211/40–41, 417; 248/346.5; 206/710, 711, 454–456; 118/500; 414/936, 941; 81/15.9; D6/449–451, 480, 482; 109/50, 62, 52; 70/50

(56) References Cited

U.S. PATENT DOCUMENTS

| D. 288,273 | * | 2/1987 | Gould ................................. D7/76 |
| D. 371,021 | * | 6/1996 | Pine et al. ............................. D6/449 |
| 3,327,889 | * | 6/1967 | Dore ..................................... 108/55.1 |
| 3,628,672 | * | 12/1971 | Heinz ................................... 211/153 |
| 4,552,271 | * | 11/1985 | Kranz ................................... 108/27 |
| 4,577,563 | * | 3/1986 | Sidler ................................... 109/52 |
| 4,772,079 | * | 9/1988 | Douglas et al. ...................... 109/50 |
| 4,884,420 | * | 12/1989 | Finkel et al. .......................... 70/62 |
| 5,322,173 | * | 6/1994 | Kay ..................................... 211/153 |
| 5,638,958 |   | 6/1997 | Sanchez ............................... 206/710 |

FOREIGN PATENT DOCUMENTS

| 843232 | * | 6/1970 | (CA) ................................. 108/55.1 |
| 1284603 | * | of 1962 | (FR) .................................. 108/27 |

* cited by examiner

*Primary Examiner*—Teri Pham
(74) *Attorney, Agent, or Firm*—Dorsey & Whitney LLP

(57) ABSTRACT

An apparatus for opening the locks of a cassette, wherein the cassette is comprised of a plurality of structural elements, and wherein the locks have an actuation area, comprising a base, an actuation element and a plurality of positioning elements wherein at least one of the positioning elements is disposed upon the base such that when at least one structural element of the cassette abuts the positioning element, the actuation element may contact the actuation area of the locks.

15 Claims, 10 Drawing Sheets

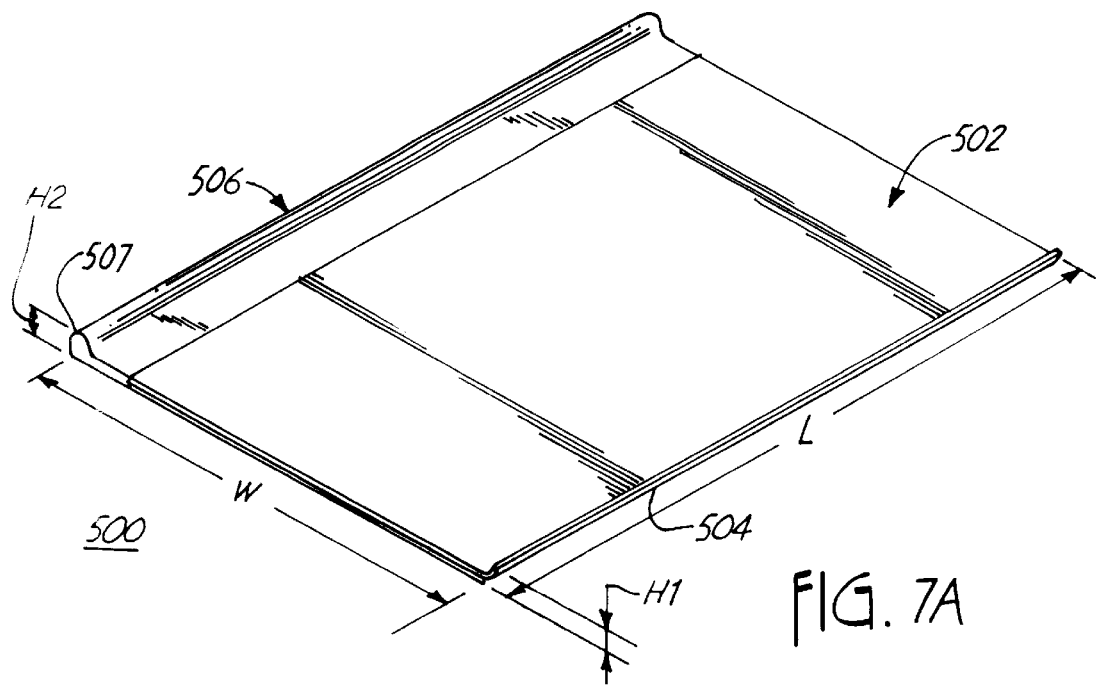
FIG. 7A
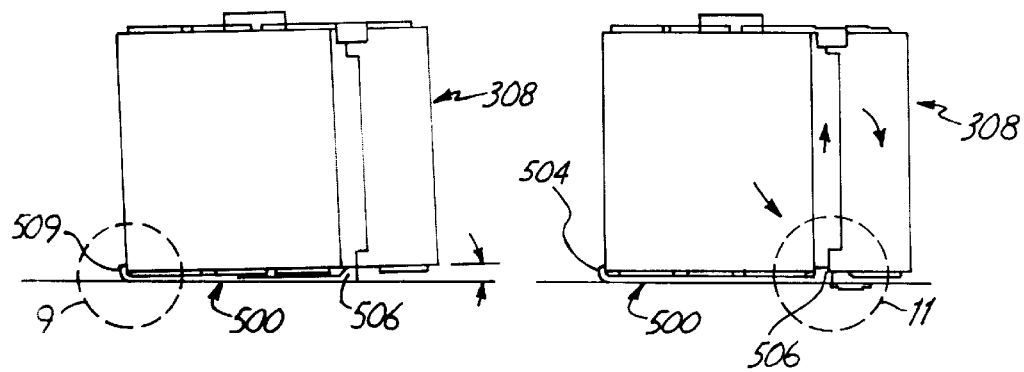
FIG. 8
FIG. 10

APPARATUS FOR ACTUATING THE RETAINING LOCKS OF A CASSETTE

This application is related to application Ser. No. 08/923,192, filed on even date herewith.

BACKGROUND OF THE INVENTION

1. Field of the Invention

The present invention relates generally to lock actuation devices. More particularly, the present invention relates to semiconductor film wafer cassette lock actuation devices.

2. Description of the Prior Art

Semiconductor film wafer cassettes are commonly used in the semiconductor industry for transporting semiconductor wafers or film frames that support semiconductor wafers from one semiconductor processing station to another. Additionally, the cassettes may be inserted into particular semiconductor wafer processing apparatus where individual semiconductor wafers may be manipulated and processed.

In many situations, these cassettes may have a locking mechanism for retaining one or more semiconductor wafers or film frames within the cassette while the cassette is being transported between semiconductor processing stations. The locking mechanism prevents the cassette contents from falling out. The loss of even one wafer or film frame can be economically significant. When a cassette is inserted into a semiconductor wafer processing apparatus, a lock actuation means within the apparatus will actuate or open the retaining locks, thus allowing the individual semiconductor wafers or film frames to be removed from the cassette for manipulation and processing, followed by later re-insertion by the apparatus.

A novel semiconductor film wafer cassette utilizing an opposing pair of retaining comb locking mechanisms or retaining comb locks, is disclosed in U.S. Pat. No. 5,638,958, assigned to Micron Technology, Inc., and hereinafter incorporated by reference. In the following descriptions, terms and reference numbers consistent with those employed in U.S. Pat. No. 5,638,958 are used. Furthermore, FIGS. 1B and 7 of U.S. Pat. No. 5,638,958 are reproduced below as FIGS. 1 and 2 and include additional details relevant to the descriptions below.

The semiconductor film wafer cassette 10 described in U.S. Pat. No. 5,638,958, and shown in FIG. 1, is generally comprised of a pair of opposing side panels 12 with inner surfaces 16 comprising slots 22 defined by tooth-shaped dividers 24. Semiconductor wafers or film frames (not shown) are inserted into the slots 22 and retained in the slots 22 by an opposing pair of retaining comb locks 28. The retaining comb locks 28 comprise slots 38, tooth-shaped projections 36, and hook-shaped lower flanges 34. In the normal or wafer-retaining condition in which the retaining comb locks 28 are closed, the slots 38 and tooth-shaped projections 36 of the retaining comb lock 28 are skewed or displaced relative to the slots 22 and dividers 24 of the side panel 12 of the cassette 10, so as to block the wafers or film frames from sliding out of slots 22. The tooth-shaped projections 36 thereby retain the semiconductor wafers or film frames within the cassette 10.

However, when a force opposing the downward biasing spring (not shown) of each of the retaining comb locks 28 is exerted upon the bottom surface 300 of each lower flange 34 (i.e., the actuation area 300 of the retaining comb locks 28), the pair of retaining comb locks 28 may be yieldingly urged upward to a minimum upward displacement position such that the slots 38 and tooth shaped projections 36 of the two retaining comb locks 28 are aligned with the slots 22 and dividers 24 of the side panels 12 of the cassette 10. This displaced position allows sliding removal of the film frames or wafers from the cassette 10. The dual comb locks 28 provide a measure of security relative to a single lock, because their actuation areas 300 are separated from each other, and both locks 28 must be actuated to release a film frame or wafer. Accidental release of one comb lock 28 is insufficient to release a film frame or wafer.

As described above, this actuation or opening of the pair of retaining comb locks 28 will usually be performed by a lock actuation means within a particular semiconductor wafer processing apparatus. However, prior to inserting or providing the cassette 10 to a processing apparatus, it may be desirable to remove manually some or all of the semiconductor wafers or film frames from the cassette 10 or to insert additional semiconductor wafers or film frames into the cassette 10. In order to remove or insert the semiconductor wafers or film frames, both retaining comb locks 28 of the cassette 10 must be temporarily actuated or opened. Thus, the security of having dual locks becomes a disadvantage, because it may take one hand to release each lock 28 (and keep it released), leaving no hand for handling the wafers or film frames.

One prior device for temporarily actuating or opening the retaining comb locks 28 of a cassette 10 is shown in FIGS. 3 and 4. As shown in FIG. 3, the device 100 is generally an inverted T-shaped bar comprising a base 102 and a raised center member 104. The base 102 provides stability for the device 100 while the raised center member 104 contacts the two actuation areas 300 of the retaining comb locks 28 as shown in FIG. 4. The device shown in FIGS. 3 and 4 may, however, be relatively difficult to operate. In most cases, an operator must use two hands to operate the device 100; one hand to hold the device 100 steady beneath the cassette 10 in alignment with both actuation areas 300, and the other hand to lower the cassette 10 onto the device 100 such that both actuation areas 300 of the retaining comb locks 28 are engaged by the raised center member 104. While the operator is lowering the cassette 10 onto the raised center member 104 of the device 100, the operator must ensure that the device 100 is properly aligned, such that both retaining comb locks 28 are simultaneously actuated or yieldingly urged upward by the raised center member 104.

Another device for temporarily actuating or opening the retaining comb locks 28 of a cassette 10 is shown in FIGS. 5A–B and 6. The device 200 generally comprises a pair of structurally connected, parallel, symmetrically-opposed guide rails 202, as shown in FIG. 5A. As shown in FIG. 5B, the guide rails 202 (only one is shown; the other is a mirror image of the first) comprise a flange 204, a slot 206 and an inclined portion 208. The flanges 204 are adapted such that the bottom portion 302 of each of the side panels 12 of the cassette 10 may be inserted and slidably retained in the slot 206. As shown in FIG. 6, as the bottom portion 302 of each cassette's side panel 12 is further inserted into the slot 206, a portion of the actuation area 300 of the lower flange 34 of the retaining comb locks 28 engages and is yieldingly urged upwards by the relative vertical increase of the inclined portion 208 of the guide rail. This occurs simultaneously with both locks 28, as the bottom portions 302 are inserted further into the parallel slots 206. If the bottom portion 302 of the side panels 12 is inserted such that the actuation area 300 reaches point 210 of the inclined portion 208, the retaining comb locks 28 will reach the minimum upward displacement and be in the actuated or open position.

However, this device 200, similar to the device 100 described above, may be relatively difficult to operate. Again, similar to the device 100 described above, an operator must generally use two hands to operate the device 200; one hand to steady the device 200, and the other hand to slidably insert the bottom portion 302 of each of the side panels 12 of the cassette 10 into the slots 206 of the opposing guide rails 202. Furthermore, due to differences in the width of cassettes 10, the distance between the parallel, opposing guide rails 202 may need to be varied to accommodate different cassettes.

Thus, there exists a need for a lock actuation device that is easy to use. There also exists a need for a lock actuation device that is relatively quick to operate, thus, saving production time and operating expenses. Furthermore, it is desirable that the device be relatively easy to align and to operate with one hand.

SUMMARY OF THE INVENTION

An apparatus for opening the locks of a cassette, wherein the cassette comprises a pair of opposing side panels, and wherein the locks have an actuation area is described. In one embodiment, the apparatus comprises a base with at least two generally opposed edges and a first and a second element each disposed along one of the opposed edges of the base such that when the rear portions of the side panels of the cassette abut the first element, the actuation area of the locks are vertically aligned with the second element. Generally, the first element acts as a positioning element for the cassette and the second element acts as a actuation element for the locks.

DESCRIPTION OF THE DRAWINGS

FIG. 7A is a perspective view of an embodiment of the present invention.

FIG. 8 a side view of the embodiment of FIG. 7A, showing the front end of a semiconductor film wafer cassette being generally lowered towards the actuation element such that the retaining comb locks are actuated.

FIG. 10 is a side view of an embodiment of the present invention showing the actuation of the retaining comb locks.

DETAILED DESCRIPTION

Figure 7B:
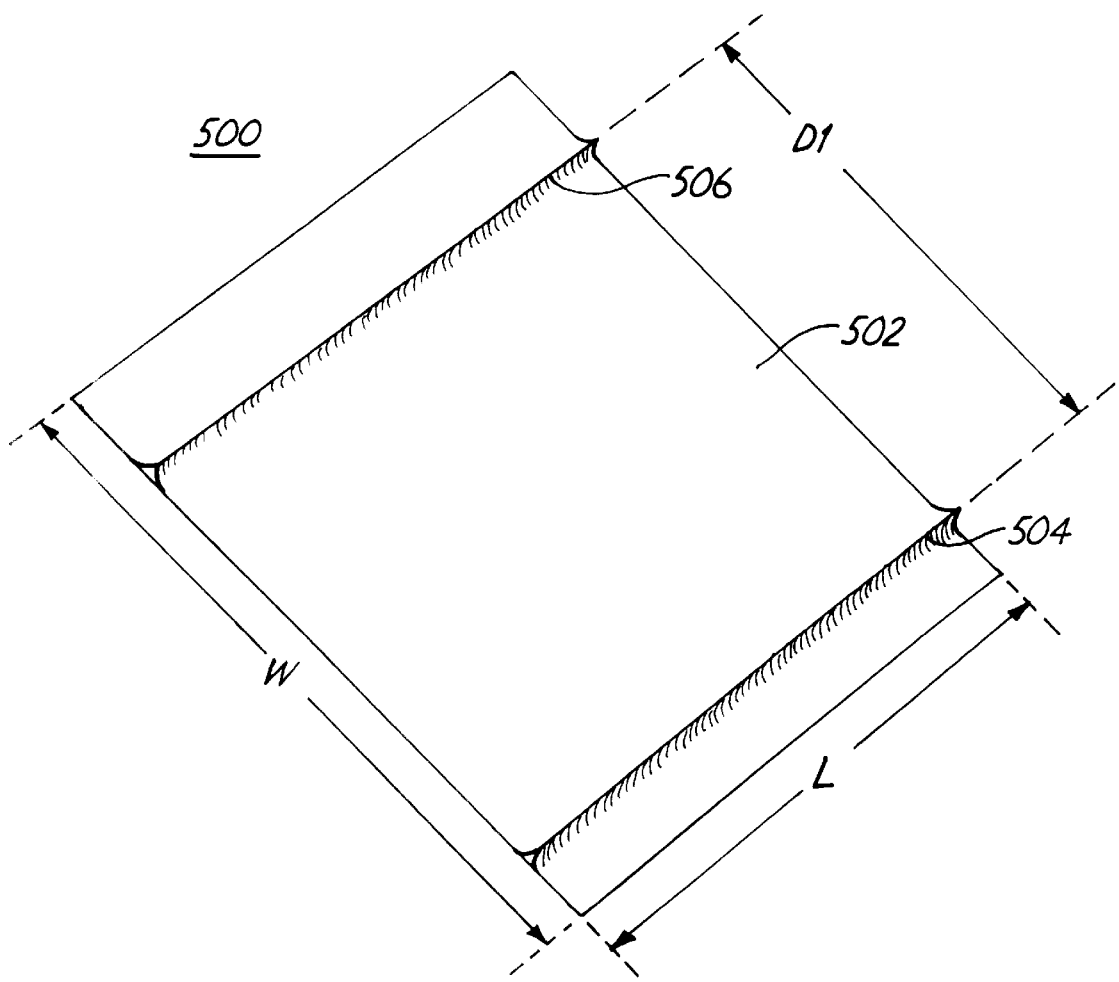
FIG. 7B is a perspective view of an alternative embodiment of the present invention.
Figure 7C:
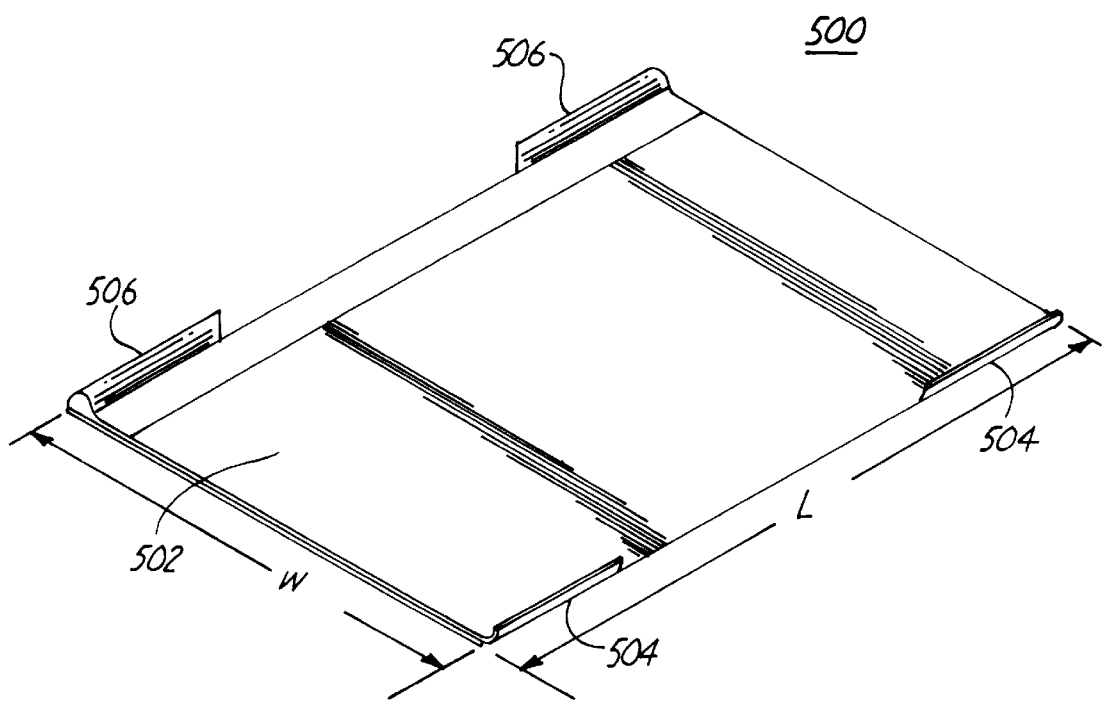
FIG. 7C is a perspective view of a further alternative embodiment of the present invention.

Referring to FIGS. 7A–C, there are shown embodiments of an apparatus for actuating the retaining locks of a cassette, referred to in its entirety as a lock actuation plate 500. Generally, the lock actuation plate 500 comprises a substantially flat rectangular base 502 having a width W and a length L, a first or positioning element 504 and a second or actuation element 506, having heights H1, H2 respectively. As shown in FIG. 7A, the first and second elements 504 and 506 may be attached to or integrally formed on opposing sides of the width of the base 502. Alternatively, as shown in FIG. 7B, the first and second elements 504 and 506 may be attached to or integrally formed upon the base 502 at positions generally disposed towards, but not on, opposing sides of the width of the base 502. In this embodiment, the first and second elements 504 and 506 are separated by a distance D1.

In the embodiment shown in FIGS. 7A–B, the first and second elements 504 and 506 have lengths L approximately equal to the length L of the base 502. However, in other embodiments, it may be desirable that the lengths of the first or the second or both the first and second elements 504 and 506 be of greater or lesser length than that of the base 502. Additionally, as shown in FIG. 7C, the first and second elements 504 and 506 may be comprised of more than one portion; i.e., the first and second elements 504 and 506 may be comprised of a plurality of length portions or segments. Furthermore, while the first and second elements 504 and 506 are shown in FIG. 7A as having different heights, in still other embodiments, it may be desirable that the heights of the first and second elements 504 and 506 be approximately equal. In the embodiments of the invention shown in FIG. 7A–C, the first and second elements 504 and 506 are substantially perpendicular to the base 502, although this is not a requirement of the invention.

The lock actuation plate 500 may be made of any rigid or semi-rigid material, such as metals, hard ceramics or plastics and the like. In the embodiment shown in FIGS. 7A–B, the second element 506 and a portion of the base 502 are encompassed by an optional protective layer 507. The protective layer 507 may provide a cushioning effect to help prevent mechanical damage to the retaining comb locks 28 due to repeated contact with the second element 506, as described below.

Figure 9:
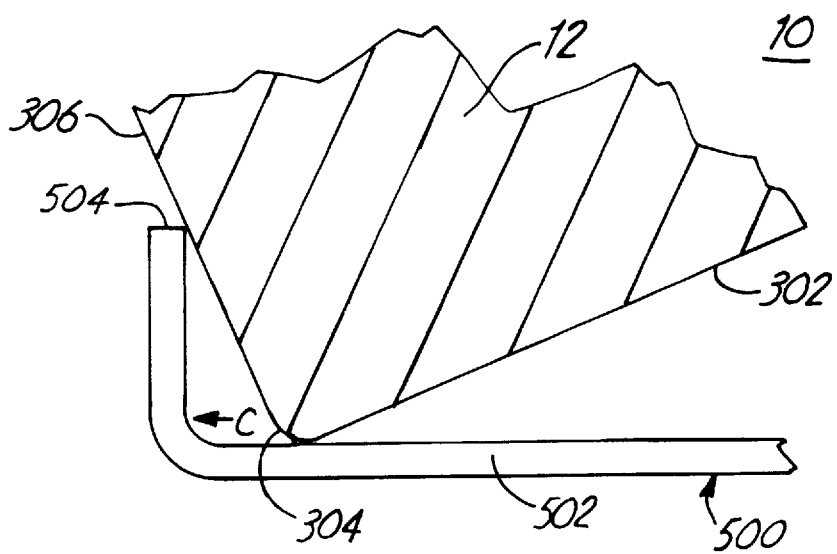
FIG. 9 is an expanded detailed view of FIG. 8.

With reference to FIGS. 8–11, the retaining comb locks 28 of a semiconductor film wafer cassette 10 may be temporarily opened by an operator utilizing the lock actuation plate 500 as follows. As shown in FIG. 9, the operator may place the cassette 10 on the lock actuation plate 500 such that the rear corner 304 of each of the side panels 12 of the cassette 10 contacts the base 502 of the lock actuation plate 500, and a point on the rear portion 306 of the side panels 12 contacts the first element 504. As shown in FIG. 10, the operator may then allow the front end of the cassette, referred to generally as 308, to move downwards toward the lock actuation plate 500. Referring again to FIG. 9, as the front end of the cassette 308 moves downwards, the rear corner 304 of the side panels 12 of the cassette 10 will, in general, slide in direction C until the bottom portion 302 of each of the side panels 12 contacts and is substantially parallel to the base 502 of the lock actuation plate 500. At this point, the rear corners 304 of the side panels 12 are relatively "nested" in the intersection formed by the first element 504 and the base 502. In this location the rear corners 304 serve as a positioning surface for the cassette 10. When the cassette 10 is in this position relative to the lock actuation plate 500, the second element 506 contacts the actuation area 300 of the retaining comb locks 28. In most cases, depending upon the downward biasing springs of the retaining comb locks 28, the overall weight of the cassette 10 will exert enough downward force on the biasing springs of the retaining comb locks 28 to urge upward and to open the retaining comb locks 28. If the weight alone is insufficient, slight downward force on the cassette 10 can be provided by the operator to release the comb locks 28.

Alternatively, the operator may position the cassette 10 such that the rear portion 306 of the cassette 10 abuts and is substantially parallel to the first element 504. The operator may then simply vertically lower the cassette 10 onto the lock actuation plate 500 until the bottom portions 302 of the side panels 12 contact and are substantially parallel to the base 502, at which point, the second element 506 will contact, urge upward and actuate the retaining comb locks 28.

Figure 1:
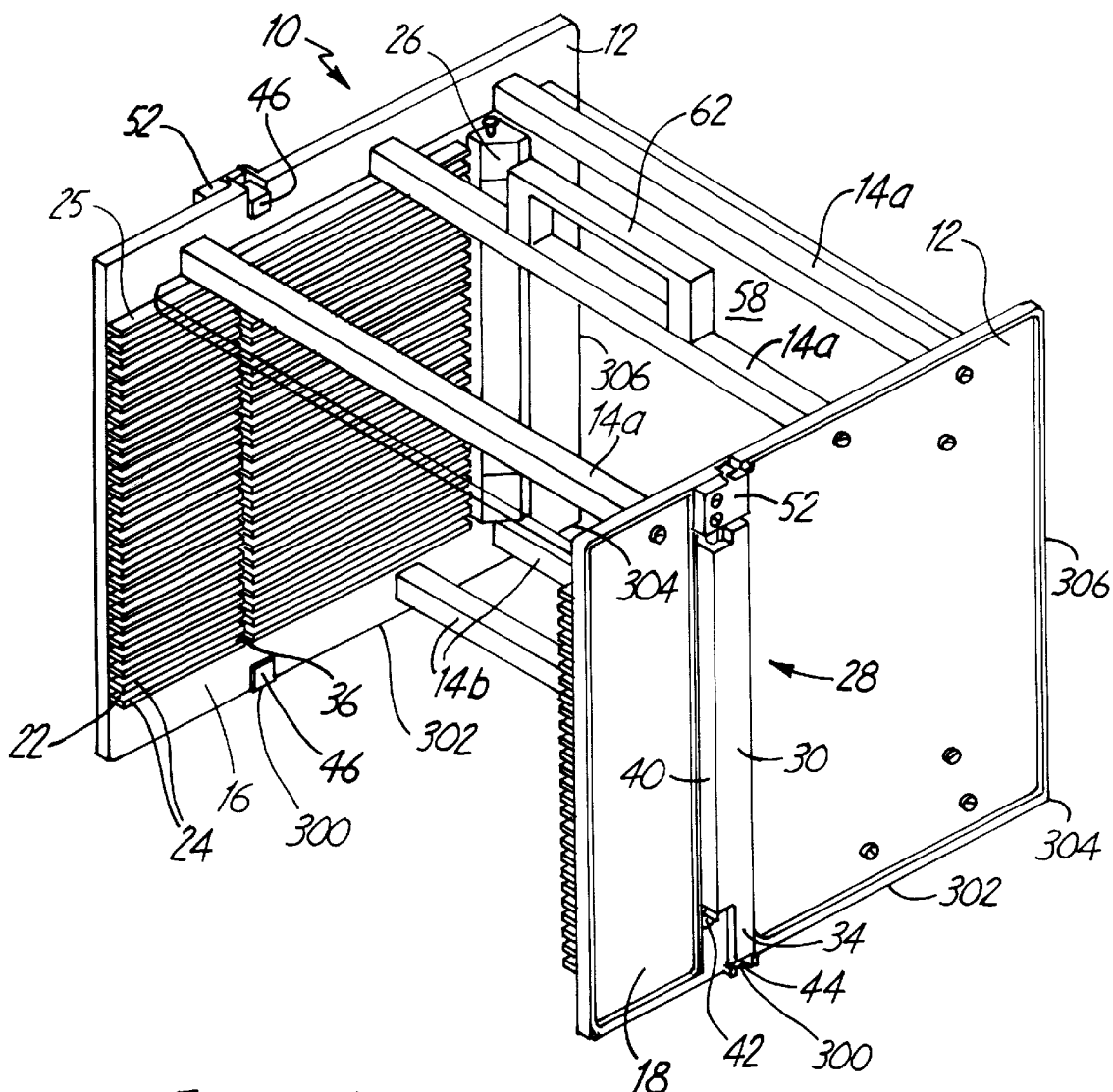
FIG. 1 is a perspective view of a prior art semiconductor film wafer cassette showing the retaining comb locks in the unlocked position.
Figure 2:
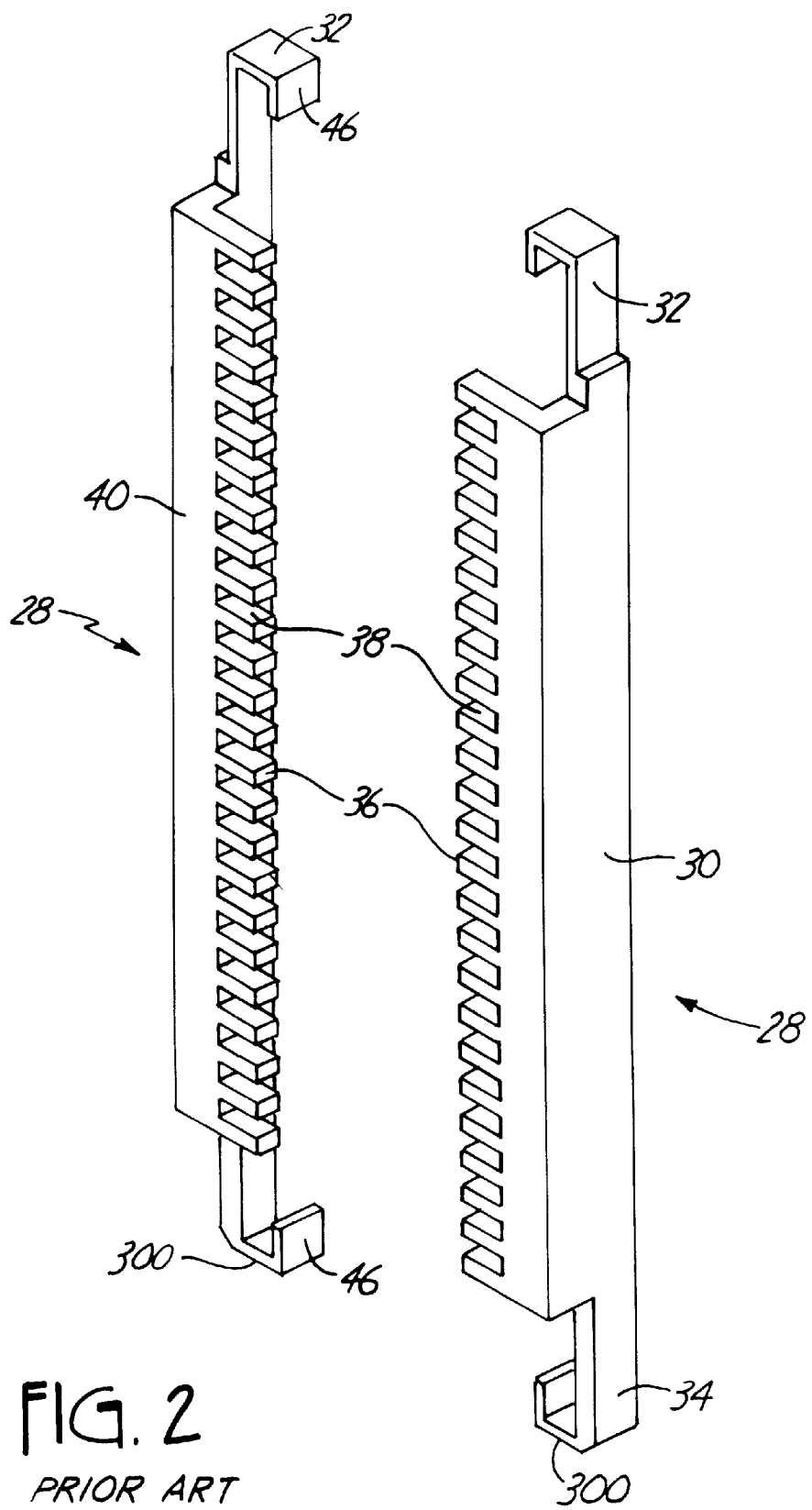
FIG. 2 is a detail view of the retaining comb locks of the cassette of FIG. 1.
Figure 3:
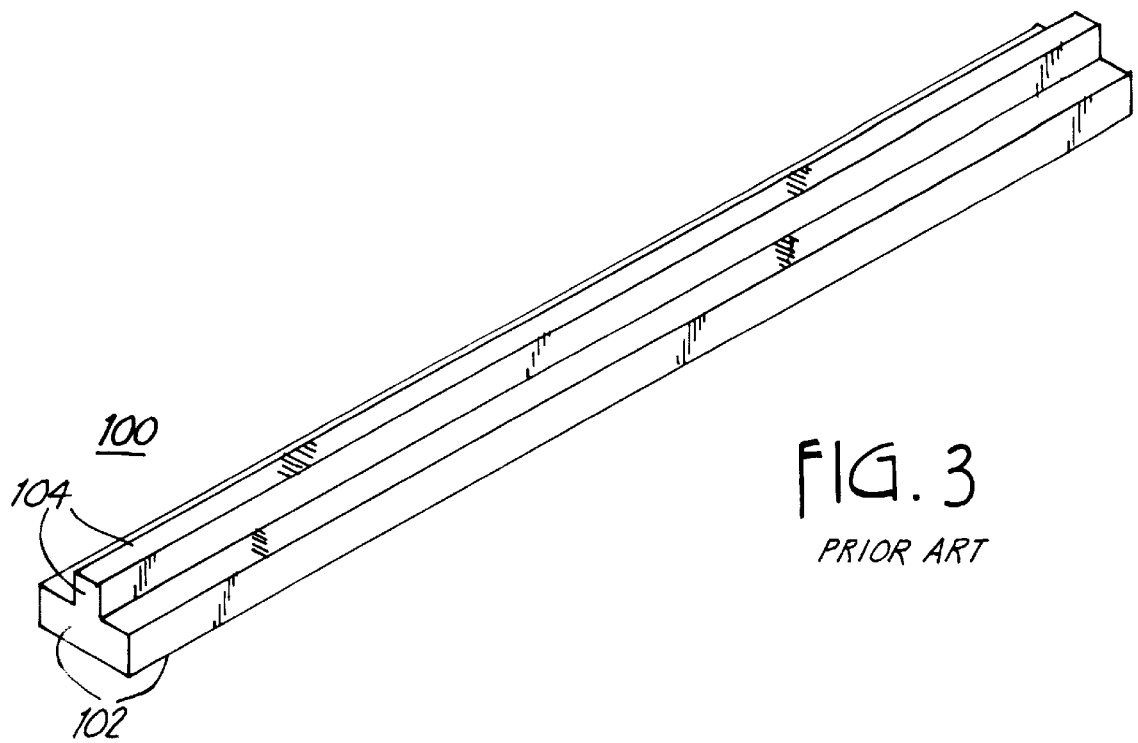
FIG. 3 is a perspective view of a prior art device for actuating the retaining comb locks of the semicoductor film wafer cassette.
Figure 4:
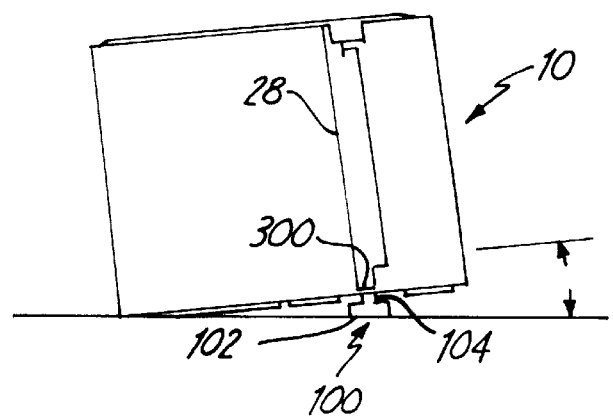
FIG. 4 is an operational view of the device of FIG. 3.
Figure 5A:
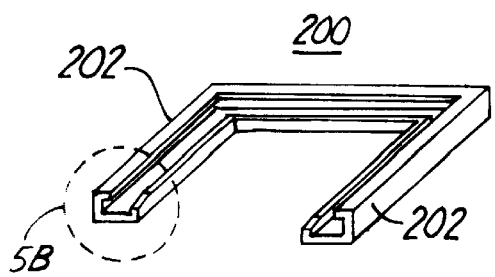
FIG. 5A is perspective view of another prior art device for actuating the retaining comb locks of the semiconductor film wafer cassette.
Figure 5B:
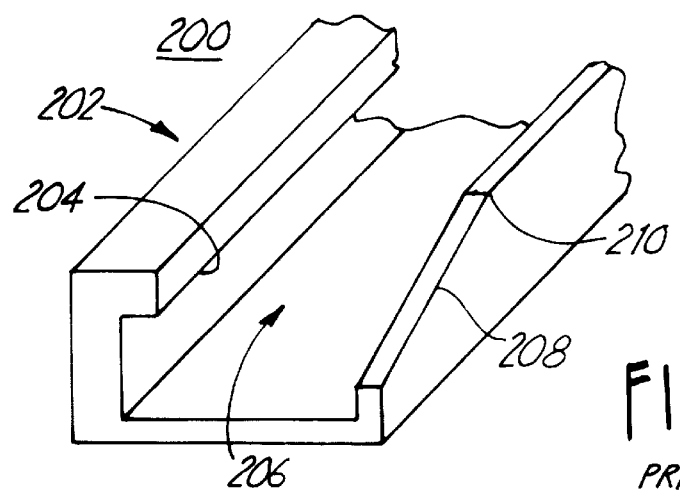
FIG. 5B is a detail view of the device shown in FIG. 5A.
Figure 6:
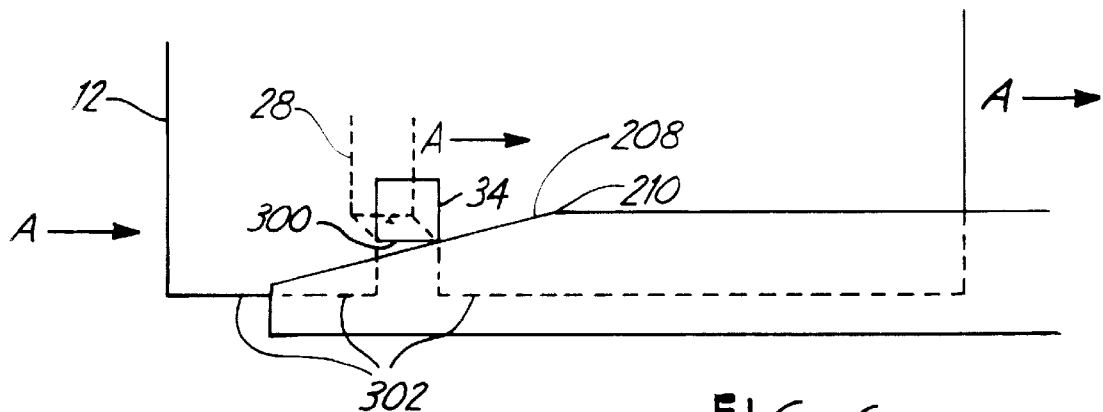
FIG. 6 is a operational view of the device of FIGS. 5A and 5B in operation.
Figure 11:
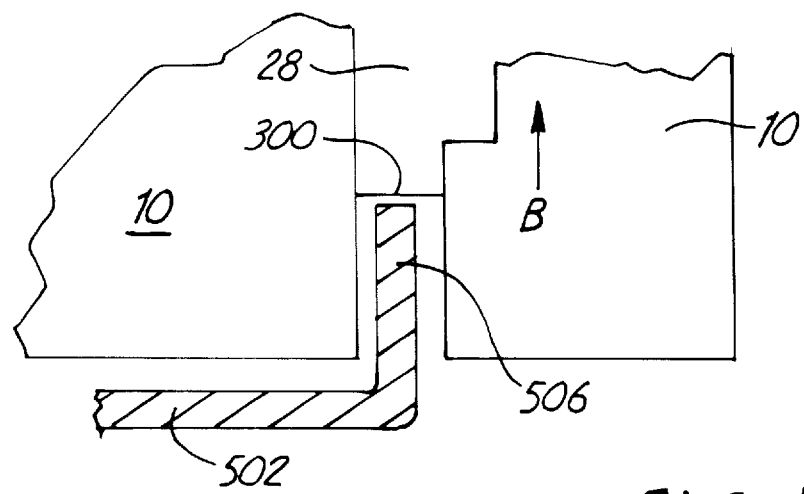
FIG. 11 is an expanded detailed view of FIG. 10.

In essence, the first element 504 acts as an alignment or positioning element for the cassette 10, in particular, for the rear portion 306 and rear corners 304 of the side panels 12 of the cassette 10. Any structural element that has a surface or surfaces that lie parallel to a line connecting the two actuation areas 300 can be used as a positioning surface that can be engaged by element 504. For example, lower cross-bar 14b of cassette 10 (see FIG. 1) could serve as a "positioning surface". The second element 506 acts as a key or actuation element for the retaining comb locks 28. As best seen in FIGS. 10–11, when the cassette 10 has been correctly positioned relative to the first, positioning element 504 of the lock actuation plate 500, the retaining comb locks 28 will be contacted and can be urged upward in the direction of arrow B (FIG. 11). The comb locks 28 are thereby actuated by the second, actuation element 506. Thus, it can be seen that an operator may relatively easily, and in most cases utilizing only one hand, position the cassette relative to the lock actuation plate 500 such that both retaining comb locks 502 can be actuated. The operator may then remove or insert wafers or film frames from the cassette 10 as desired.

Referring to FIGS. 7A–11, the relative widths, lengths, heights and other dimensions of the components of a lock actuation plate 500 may be selected as follows. The distance between the first, positioning element 504 and the second, actuation element 506, which is equal to the width W of the base 502 of the lock actuation plate 500 in FIGS. 7A and 7C and the distance Dl in FIG. 7B, should be equal to the horizontal distance between the rear portion 306 of the side panels 12 (or other positioning surface) of the cassette 10 and the actuation areas 300 of the retaining comb locks 28.

The length of the first and second elements 504 and 506 of the lock actuation plate 500 should be at least equal to the distance between the actuation areas 300 of the opposing retaining comb locks 28 of the cassette 10. Having the length of these element 504, 506 be greater than the distance between the actuation areas 300, makes use by an operator easier, because the operator can position the rear corners 304 in a range of positions along the length of element 504, without worrying about the exact lateral positioning. In the embodiment shown in FIG. 7A, the length L of the base 502 is approximately equal to the length of the first and second elements 504 and 506, although this is not a requirement of the invention.

The height H2 of the second element 506 should be approximately equal to the minimum upward displacement required to open the retaining comb locks 28, as described above. In general, there are no minimum or maximum heights H1 required for the first element 504, other than it being required that the first upright member 504 have at least a nominal minimum height such that the first element 504 may act as a locator or positioning element for the cassette 10, as described above. However, in some embodiments, it may be desirable that the heights of the first and second elements 504 and 506 be approximately equal and not less than the minimum upward displacement required for lock release. In these embodiments, the lock actuation plate 500 may function "bi-directionally"; i.e., the upright members 504 and 506 may interchangeably function as the locator or positioning element, with the opposing element functioning as the lock actuation element.

Figure 12:
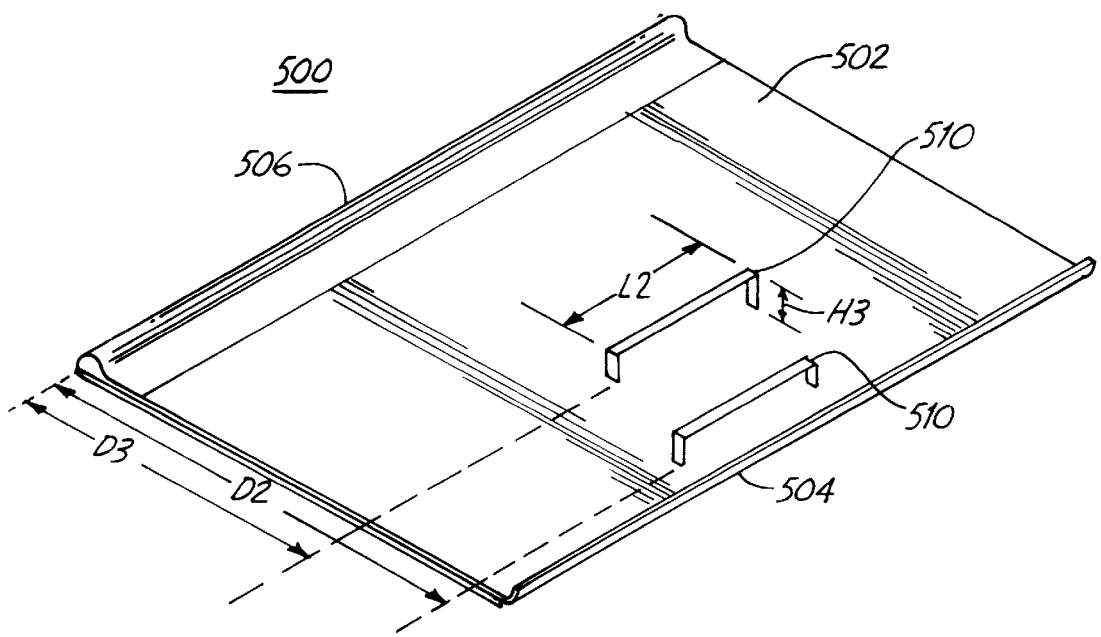
FIG. 12 is a perspective view of a still further alternative embodiment of the invention.

Another embodiment is shown in FIG. 12. In this embodiment, the lock actuation plate 500 has a plurality of secondary or alternative positioning elements 510, in addition to the first element 504. In general, these alternative positioning elements 510 allow the lock actuation plate 500 to be used with cassettes 10 having a variety of sizes, in particular, cassettes 10 with different horizontal distances between the selected positioning surface (e.g., rear portion 306 of the side panels 12 of the cassettes 10 or lower cross bar 14b, shown in FIG. 1) and the actuation areas 300 of the retaining comb locks 28. The alternative positioning elements 510 may have a height H3 and a length L2. In the embodiment shown in FIG. 12, the alternative positioning elements 510 are generally disposed towards the center width axis of the base 502, at various distances (e.g., D2, D3) from the second, actuation element 506. The alternative positioning elements 510 may be attached to or integrally formed with the base 502.

Figure 13:
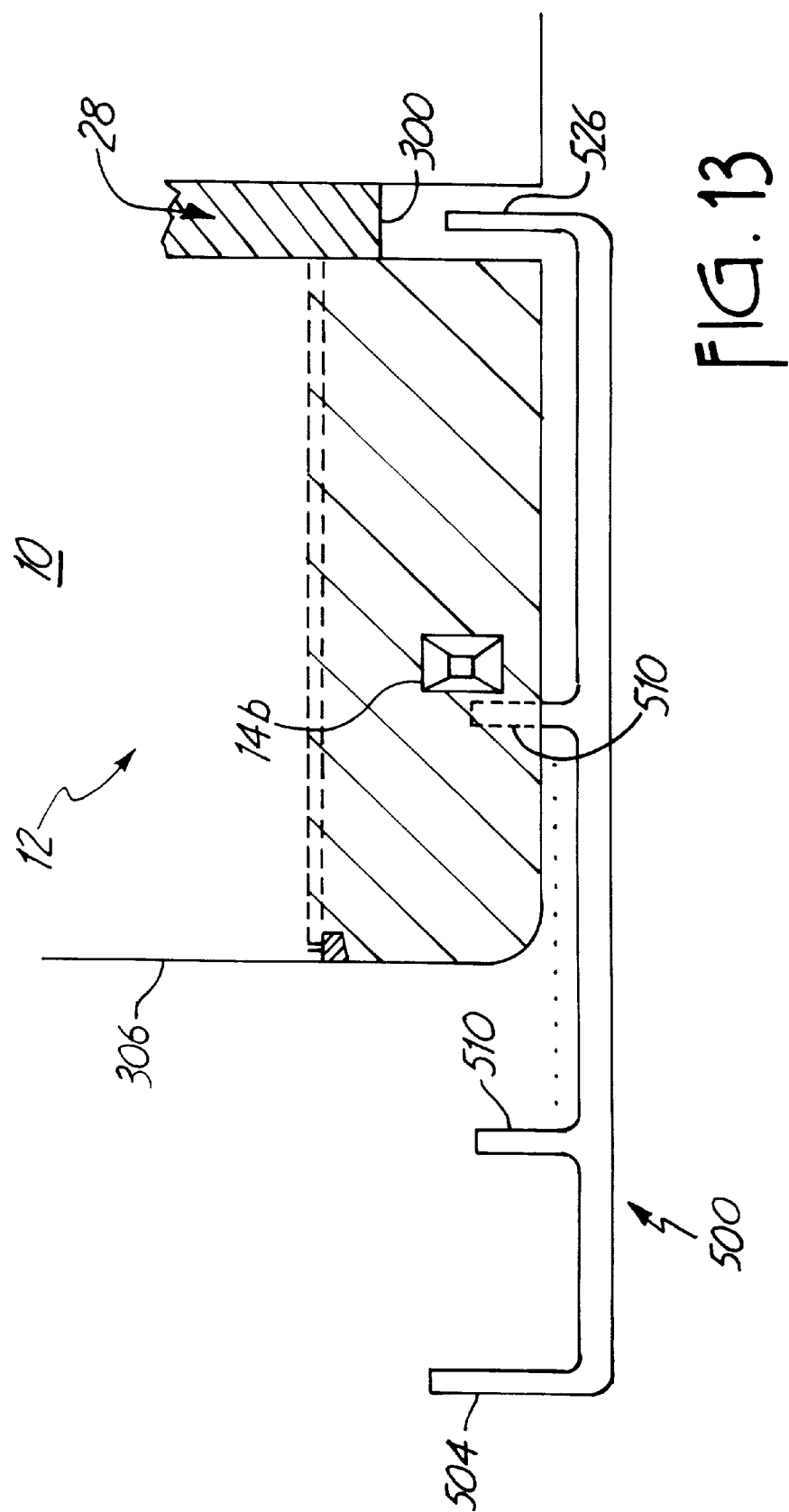
FIG. 13 is a side view of the embodiment of the invention of FIG. 12 in operation, showing one of a plurality of positioning elements operating to position the cassette for lock actuation.

The operation of this embodiment of the invention is shown in FIG. 13. In FIG. 13, the distance between the rear portion 306 of the side panels 12 of the cassette 10 and the actuation areas 300 of the retaining comb locks 28 is smaller than the distance between the positioning element 504 and the actuation element 506. However, an alternative positioning element 510 is disposed relative to the actuation element 506, such that when one of the structurally supporting lower cross bars 14b of the cassette 10, or any other suitable positioning structure upon the cassette 10, abuts the alternative positioning element 510, the actuation element 506 is positioned to contact, urge upward and actuate the retaining comb locks 28. In general, the alternative positioning elements 510 may have a height H3 such that the alternative positioning element 510 does not engage or otherwise interfere with the removal or insertion of the lowermost film frame or wafer (shown in phantom in FIG. 13). Additionally, the alternative positioning element 510 should have a minimum length L2 such that the cassette 10 is stably oriented (through the abutment of the lower cross bar 14b or other structural element with the alternative positioning element 510) and cannot be easily turned or rotated about the alternative positioning element 510.

The present invention has been described relative to operation with the semiconductor film wafer cassette 10 disclosed in U.S. Pat. No. 5,638,858. However, it will be apparent to those skilled in the art that the present invention may be used with a variety of other semiconductor film wafer cassettes utilizing a variety of somewhat similar locking mechanisms, and that other forms, details and modifications may be made to the present invention to conform the present invention thereto. For example, the front corners of the side panels 12 of a cassette 10 could also be used as a positioning surface. This is done by reversal of the first and second elements 504, 506. The operator would position the front corners of the side panels 12 against the positioning element 504 of a lock actuation plate 500 and lower the lock actuation areas 300 onto the actuation element 506. Accordingly, the invention is only limited as defined in the appended claims.

What is claimed is:

1. A system comprising:
   (a) a cassette comprising:
      (1) at least one positioning surface; and
      (2) at least one lock with a lock actuation area separated from the positioning surface; and
   (b) a lock actuation plate comprising:
      (1) a base;
      (2) a positioning element on the base for engaging the at least one positioning surface; and
      (3) an actuation element on the base for engaging the at least one actuation area;
      wherein the distance between the positioning element and the actuation element is approximately the distance from the at least one positioning surface of the cassette to the at least one lock actuation area of the cassette, and
      wherein the at least one lock of the cassette is a comb lock having a minimum displacement for opening the lock and the positioning element and the actuation element each have a height not less than such minimum displacement.

2. The system of claim 1 wherein the heights of the positioning element and the actuation element above the base are approximately equal.

3. The system of claim 1 wherein the base is substantially rectangular and wherein the positioning element and the actuation element are integrally formed on opposing sides of the base.

4. The system of claim 1 further comprising at least one alternative positioning element located between the actuation element and the positioning element.

5. The system of claim 4 wherein the at least one alternative positioning element is positioned approximately along the center width axis of the base.

6. The system of claim 1 wherein the cassette comprises a pair of side panels and the at least one positioning surface comprises a portion of each side panel.

7. The system of claim 6 wherein the at least one positioning surface comprises a rear portion of each side panel.

8. The system of claim 7 wherein the at least one positioning surface comprises a front portion of each side panel.

9. A system comprising:
   (a) a cassette comprising:
      (1) at least one positioning surface; and
      (2) at least one lock with a lock actuation area separated from the positioning surface; and
   (b) a lock actuation plate comprising:
      (1) a base;
      (2) a positioning element on the base for engaging the at least one positioning surface; and
      (3) an actuation element on the base for engaging the at least one actuation area;
      wherein the distance between the positioning element and the actuation element is approximately the distance from the at least one positioning surface of the cassette to the at least one lock actuation area of the cassette, and
   wherein the at least one lock of the cassette comprises a pair of spatially-separated locks and the length of at the actuation element is such that it engages each of the pair of spatially-separated locks.

10. The system of claim 9 wherein the locks have a minimum displacement that causes the locks to open, and wherein the height of the actuation element is not less than the minimum displacement.

11. The system of claim 10 wherein the heights of the positioning and actuation elements are approximately equal.

12. The system of claim 9 wherein the locks comprise retaining comb locks.

13. The system of claim 12 wherein the comb locks comprise a pair of comb locks, one associated with each of two side panels of the cassette.

14. The system of claim 13 wherein the comb locks are released by displacement of an actuation area and the actuation element is positioned to contact and displace the actuation area of the comb locks.

15. The system of claim 14 wherein the positioning and actuation elements are integrally formed with the base.

* * * * *